(12) United States Patent
Cooke (10) Patent No.: US 6,420,879 B2
(45) Date of Patent: *Jul. 16, 2002

(54) SYSTEM AND METHOD FOR MEASUREMENT OF PARTIAL DISCHARGE SIGNALS IN HIGH VOLTAGE APPARATUS

(75) Inventor: Chathan M. Cooke, Belmont, MA (US)

(73) Assignee: Massachusetts Institute of Technology, Cambridge, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/017,016

(22) Filed: Feb. 2, 1998

(51) Int. Cl.$^7$ .......................... H01H 9/50; G01R 31/00; G01R 31/06

(52) U.S. Cl. .................. 324/536; 324/501; 324/547

(58) Field of Search ................ 324/536, 501, 324/547, 142, 72, 629

(56) References Cited

U.S. PATENT DOCUMENTS

| | | | | |
|---|---|---|---|---|
| 3,775,676 A | * | 11/1973 | Harrold et al. | 324/536 |
| 4,006,410 A | * | 2/1977 | Roberts | 324/536 |
| 4,158,169 A | * | 6/1979 | Harrold | 324/536 |
| 4,446,420 A | | 5/1984 | Drouet | 324/536 |

(List continued on next page.)

FOREIGN PATENT DOCUMENTS

| | | |
|---|---|---|
| DE | 295 18 286 | 1/1996 |
| JP | 59132373 | 7/1984 |
| JP | 10170593 | 6/1998 |
| WO | WO 97/10515 | 3/1997 |

OTHER PUBLICATIONS

Cooke, EPRI Substation Equipment Diagnostics Conference, "Electrical partial discharge ditection by PD pulse--waves", New Orleans, pp. 1–9, Feb. 6, 1996.

Vaillancourt et al., IEEE Transactions on Power Delivery, "Digital acquisition and processing of partial discharges during acceptance test of HV transforms", vol. 4, No. 1, p. 421–427, Jan. 1989.

Pearson et al., IEEE Transactions on Dielectrics and Electrical Insulation, "Partial discharge diagnostics for gas insulated substations", vol. 2, No. 5, pp. 893–905, Oct. 1995.

Nattrass, IEEE Electrical Insulation Magazine, "Partial discharge measurement and interpretation", vol. 4, No. 3, pp. 10–23, May/Jun. 1988.

Harrold et al., IEEE Transaction on power apparatus and systems, "Corona location in transformers by radio frequency spectrum analysis, Part I: theory", vol. PAS–89, No. 7, pp. 1584–1590, Sep./Oct. 1970.

(List continued on next page.)

Primary Examiner—Michael J. Sherry
Assistant Examiner—Jermele M. Hollington
(74) Attorney, Agent, or Firm—Samuels, Gauthier & Stevens, LLP (57) ABSTRACT

A system is disclosed for monitoring electrical partial discharge signals in electrical power apparatus. The apparatus includes a housing and a plurality of openings in the housing through which electrical power may pass via electrical power contact units. The system includes a plurality of sensor units, each being in communication with, and associated with, an electrical power contact unit at each opening in the housing. The sensor units are for sensing partial discharge signals at each opening in the housing and for producing sensor output signals. The system also includes a control unit for simultaneously and synchronously receiving the sensor output signals over an interval of time, and produces simultaneous synchronous output signals. The system also includes a processing unit for processing the simultaneous synchronous output signals.

15 Claims, 5 Drawing Sheets

U.S. PATENT DOCUMENTS

| | | | | |
|---|---|---|---|---|
| 5,107,447 | A | * | 4/1992 | Ozawa et al. ................ 324/536 |
| 5,252,927 | A | * | 10/1993 | Bruhlmeier et al. ......... 324/536 |
| 5,386,193 | A | * | 1/1995 | Maeda et al. ................ 324/538 |
| 5,506,511 | A | * | 4/1996 | Nilsson et al. ............... 324/536 |
| 5,530,364 | A | * | 6/1996 | Mashikian et al. .......... 324/536 |
| 5,530,366 | A | * | 6/1996 | Nasrallah ..................... 324/547 |
| 5,804,972 | A | * | 9/1998 | De Kock et al. ............ 324/536 |
| 5,903,158 | A | * | 5/1999 | Eriksson et al. ............. 324/536 |
| 5,917,316 | A | * | 6/1999 | Bosco et al. ................. 324/536 |
| 5,933,012 | A | * | 8/1999 | Bengtsson et al. ........... 324/547 |

OTHER PUBLICATIONS

Harrold, IEEE Transactions on power apparatus and systems, "Corona location in transformers by radio frequency spectrum analysis, II Application of technique and results of measurements", vol. PAS–89, No. 7, pp. 1591–1602, Sep./Oct. 1970.

Haessing et al., IEEE Transactions on electrical insulation, "Detection and location of internal defects in the insulation of power transformers", vol. 28, No. 6, pp. 1057–1067, Dec. 1993.

R. Lortie et al., "Partial Discharge Detection on Power Transformers Using a Multi–Terminal Measurement Method", $10^{th}$ Symposium on High Voltage Engineering, pp. 267–270, 1997.

J. Fuhr et al., "Detection and Location of Internal Defects in the Insulation of Power Transformers, " IEEE Transactions on Electrical Insulation, vol. 28, n. 6, pp. 1057–67, 1993.

* cited by examiner

SYSTEM AND METHOD FOR MEASUREMENT OF PARTIAL DISCHARGE SIGNALS IN HIGH VOLTAGE APPARATUS

BACKGROUND OF THE INVENTION

The invention relates to high power electrical apparatus, and particularly relates to sensing systems for detecting electrical partial discharges in high power electrical apparatus.

Partial discharges are pulse events with a sudden localized redistribution of charge in or on high voltage insulating materials at high electric stress. The detection of partial discharges is significant because partial discharge events are frequently an indicator of failure processes that are active within or on the insulation.

The pulse discharge event itself is typically of a very short duration. That is, the redistribution of charge, and hence pulse currents, associated with partial discharge events typically occur in the sub-microsecond time scale. Time duration values of 10 nanoseconds ($10^{-8}$) and less can also occur.

Certain conventional partial discharge methods employ detection schemes based on a low-voltage external resonant circuit, typically of the R-L-C type, that is connected either in series or in parallel with the high voltage insulation of the power transformers. In both serial and parallel detection schemes, the coupling capacitor and the resonant detection circuit are in series to yield a closed-loop path for the current in the short duration partial discharge pulse event. Typically, an inductive impedance isolates the partial discharge pulse loop from the external source of high voltage. The R-L-C type resonant circuit is conventionally set to a resonant frequency in the range of 30 kHz to 300 kHz and set to be under-damped so as to yield a ringing waveform impulse response.

With this arrangement, the partial discharge event is typically of a duration much shorter than a period of the detection circuit resonant frequency and hence would act like an impulse and stimulate the resonant circuit natural response to yield a waveform referred to as a "ringing waveform". This ringing waveform is at a defined frequency and could be readily detected with standard amplifier and display electronics. The ringing waveform has a beginning peak amplitude and an oscillation period as defined by the resonant circuit. The amplitude (or size) of the ringing response is also dependant on the size of the partial discharge event. Because the partial discharge events are much shorter in duration than the period of the resonant circuit, the response of conventional partial discharge systems is always the same basic ringing impulse response. This distinct response to all partial discharge events permits detection electronics to be quite simple, sometimes only utilizing the display of an oscilloscope.

The defined ringing response also enables the use of modern digital pulse height counting techniques to quantify the size of each event according to the peak size of the response. This digital acquisition and storage of pulse heights is a common method of partial discharge measurements since many events can be accumulated to yield a histogram of pulse height sizes versus the number of occurrences. Additionally, the time of occurrence (phase) relative to a 60Hz power frequency of an applied AC high voltage can be recorded and used to present the pulse height information according to phase position on the 60 Hz voltage waveform.

Each of these conventional partial discharge measurements begin from a condensation- of the partial discharge event into a single size or height quantity. Subsequently, additional information such as the number of occurrences within a specified time, is used to yield added information about many events. Also, information regarding the event moment relative to an applied AC voltage may be recorded to yield further information regarding many events.

This conventional method has been successful for the detection of partial discharge events in situations such as laboratories and factories where extraneous unknown pulse signals are eliminated. Because the resonant circuit will yield the same ringing response to any pulse drive signal that is short when compared to the ring frequency, the method cannot distinguish extraneous noise signals from actual partial discharge events. Attempts to apply the conventional partial discharge measurement to in-service applications, have not been fully satisfactory, in part, because external noise pulses cannot be distinguished from, and are often equal or larger in size than, actual partial discharge signals.

Noise detection and elimination have been attempted using various different frequencies and/or frequency spectral analysis, using digital methods such as neural networks, and also using background subtraction. Practical partial discharge measurement of in-service exposed apparatus, such as power transformers, is however, severely limited by external noise, even with the various additions to conventional partial discharge measurement. The resonant circuit detection requires that all pulses yield the same response. For this reason, the pulse origin is not identifiable.

Other more recently developed techniques for partial discharge measurement do not use a resonant circuit detection scheme. Instead, each partial discharge signal is recorded as a fast-pulse time waveform using a broadband recording device so that details of each individual event are preserved. Results of this type of measurement have shown that distinctive waveforms are recorded with time details in the sub-microsecond range and frequency content extending well beyond 20 MHz, even for the case of power transformers.

Moreover, detection of individual partial discharge signals at more than one location has shown that recorded signals at different locations are not the same. While certain frequencies may exhibit common responses at multiple terminals, when broader bandwidth signals are used clearly distinctive responses are detected at different locations. A cause for this difference in signal waveform at different detection sites is the different paths of propagation from the original site of the partial discharge signal to the locations of detection.

Other tests involving simulated partial discharge pulse signals with fast nanosecond timeframe transitions applied to power transformers confirm that the recorded waveforms are always different when detected at different locations. Both time delay and waveshape changes were detected at different detection locations.

These findings substantiate the view that partial discharge signals, being very localized and very rapid, therefore, release a pulse of energy that propagates out from its site of origin. The propagation occurs according to the structure surrounding the partial discharge event. An internally generated partial discharge pulse will thus propagate and appear at the end regions, such as a high or low voltage bushing, as specific pulse waves in accordance with the structure, the location of the origin of the signal, and the signal characteristic itself. Not only is there a received pulse height or size, but also a full wave shape including propagation time delays. Thus sufficiently broadband measurements reveal a distinctive pulse wave response for each partial discharge event, and not simply a size or magnitude component. This distinctive response may be compared with other signals to perform waveform recognition.

One example of the use of pulse waveform recognition is in the application of time domain reflectometry (TDR). In TDR an injected signal of known characteristics is injected and then recorded after propagation so as to evaluate the characteristics of the propagation path.

Another technique to better distinguish pulses associated with internal partial discharge signals from external noise, is to consider the nature of the apparatus being measured. In particular, for many power systems such as power transformers or power cables, the high voltage insulation is surrounded by a metallic tank or enclosure. A fully enclosed tank is often used to contain insulating oil and to protect against the elements of the external environment such as moisture. Such an enclosure also provides shielding, by the Faraday cage effect, of the internal region from external pulse discharge noise sources. Most pulse electric fields and magnetic fields cannot penetrate highly conductive materials and hence an enclosed tank serves as a shield so that external pulse signals are repelled. Because connections are required, holes must be cut through the tank in specific places, for example for electric bushings to bring power into or out from an internal transformer winding. External fields and disturbances may then migrate into the tank through the holes.

There is a need for a system for monitoring partial discharges in an electrical power apparatus that permits one to discern whether discharge signals have originated outside or inside of the housing.

There is also a need for a system for monitoring partial discharges in an electrical power apparatus that permits one to localize the origin within the housing from which a partial discharge has occurred.

There is also a need for system for monitoring partial discharge in electrical power apparatus that permits rapid evaluation of partial discharge activity from only a few recorded events.

SUMMARY OF THE INVENTION

A system is disclosed for monitoring electrical partial discharge signals in electrical power apparatus. The apparatus includes a housing and a plurality of openings in the housing through which electrical power may pass via electrical power contact units. The system includes a plurality of sensor units, each being in communication with, and associated with, an electrical power contact unit at each opening in the housing. The sensor units are for sensing partial discharge signals at each opening in the housing and for producing sensor output signals. The system also includes a control unit for simultaneously and synchronously receiving the sensor signals over an interval of time, and produces simultaneous synchronous signals. The system also includes a processing unit for processing the simultaneous synchronous output signals. In various embodiments, any number of openings may exist in the housing, but there must be a sensor associated with each and every opening.

BRIEF DESCRIPTION OF THE DRAWINGS

The following detailed description of the illustrated embodiments may be further understood with reference to the accompanying drawings in which.

DETAILED DESCRIPTION OF THE ILLUSTRATED EMBODIMENTS

The invention provides a system and method for monitoring and analyzing partial discharge signals in high voltage apparatus. The system employs broadband, high fidelity recordings of the partial discharge signals, recording the time waveforms for each signal. The propagation characteristics may be discerned from the details of the waveform. Further, any partial discharge signal that is recorded with a broadband recorder simultaneously at different locations will result in different time waveforms according to the characteristics of the path from the signal origin to the detection sites.

In one embodiment of a system of the invention, the partial discharge signals are detected with broadband sensors, synchronously at all major connections that penetrate the surrounding metallic tank enclosure. For example, in power transformers or cables, this is at all major electric power connection bushings that penetrate the external tank or enclosure. With such a measurement system, it has been found that pulse event signals are readily detected at all bushing detection sites. For example, pulse currents may be detected by using bushing capacitive taps that receive the discharge signal by capacitive coupling at the transformer bushing. Another method of obtaining a high fidelity voltage signal that is proportional to the partial discharge pulses, is by using an inductive-type fast pulse current sensor.

Figure 1:
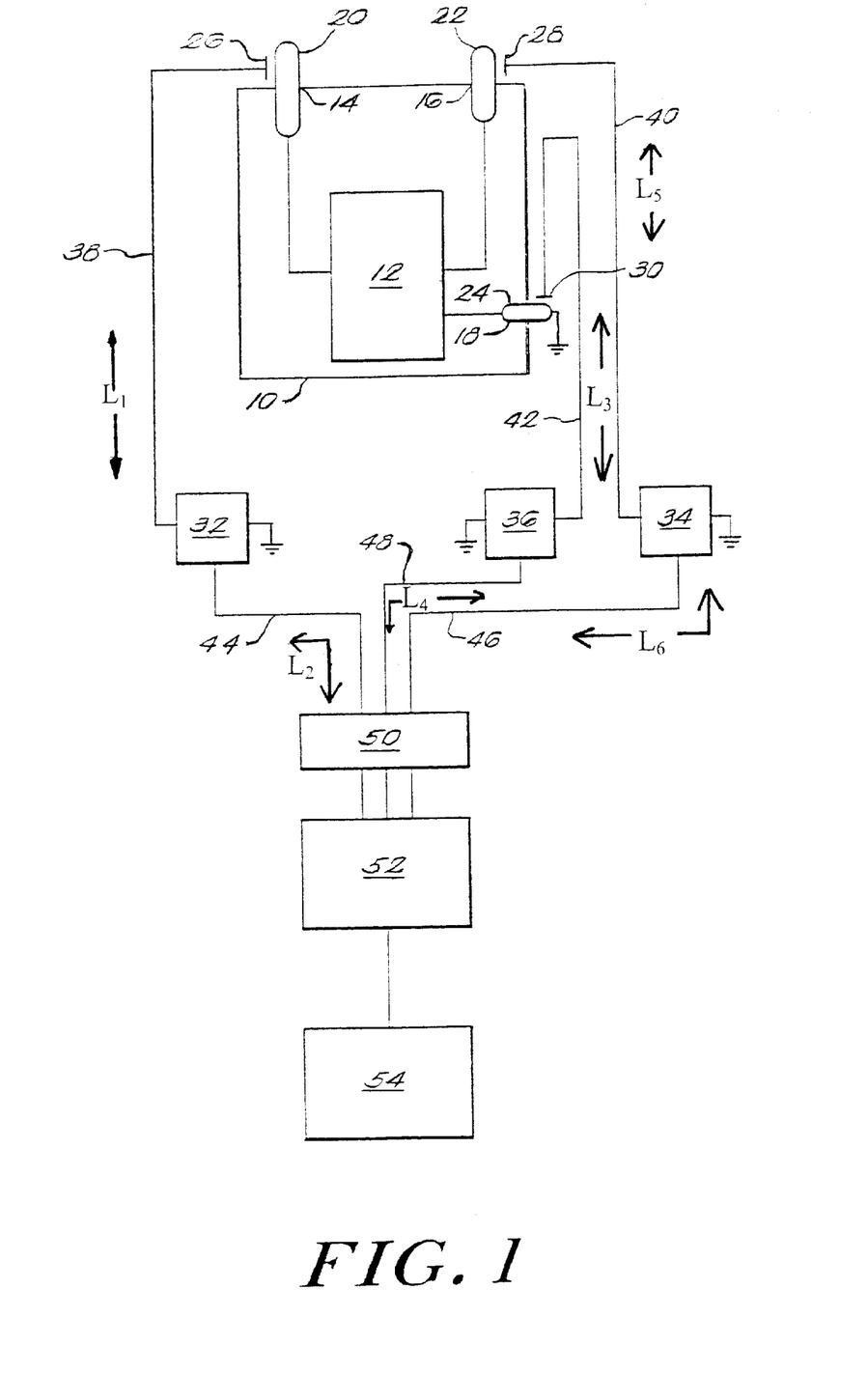
FIG. 1 is an illustrative block diagram of a system of the invention.

As shown in FIG. 1, in an embodiment of the invention, a transformer including a housing 10 and windings 12, has three openings (or bushing feedthroughs) 14, 16, and 18 in the housing. Through the first opening 14 extends a high voltage bushing 20, through the second opening 16 extends a low voltage bushing 22, and through the third opening 18 extends a neutral bushing 24 for connection to a neutral voltage or ground. Capacitive bushing taps 26, 28, and 30, are attached to each of the bushings 20, 22, and 24 respectively. Each of the bushing taps is connected to a broadband high frequency sensor 32, 34, or 36, via a cable 38, 40, or 42 respectively. The sum of the length of cables 38 and 44 ($L_1+L_2$) must be equal to the sum of the length of cables 40 and 46, ($L_5+L_6$) which must also equal the sum of the length of cables 42 and 48 ($L_3+L_4$) to ensure sufficient synchronization of the sensor output signals (i.e., that the signals are within 20 nano seconds, and preferably within 2 nano seconds of each other) in the present embodiment. Suitable sensors are the PPD-DS-103A-3A broadband sensors sold by Ion Physics of Atkinson, New Hampshire. All cables are preferably RG-8A coaxial cables.

The cables 44, 46, and 48 are fed through a conduit (not shown) and brought to a termination station 50, and then to a fast waveform digitizer 52, such as the TDS-540 (with 50 k memory) or the TDS-744A, both of which are sold by Tektronix, Inc. of Beaverton, Oregon. The output of the digitizer 52 is converted to an IEEE-GPIB interface format and input to a computer processor 54 such as a MacIntosh 7200/75 by Apple Computer, Inc. having a GPIB interface and at least 24 megabytes of RAM.

Because the outputs of the sensors are synchronized (due, in part to sum of the lengths of the cables 38 & 44, 40 & 46 and 42 & 48 being sufficiently equal), the processor may analyze the full recorded partial discharge signals at every opening in the housing at exactly the same time. This permits the processor to identify characteristics (such as timing and waveshape) in the recorded signals that indicate whether the signal is from a source inside or outside of the housing. It is also possible due to the benefits of the invention, to localize the relative origin within the housing of the partial discharge event based on propagation analysis, as well as to determine the nature of the original partial discharge event.

Figure 2:
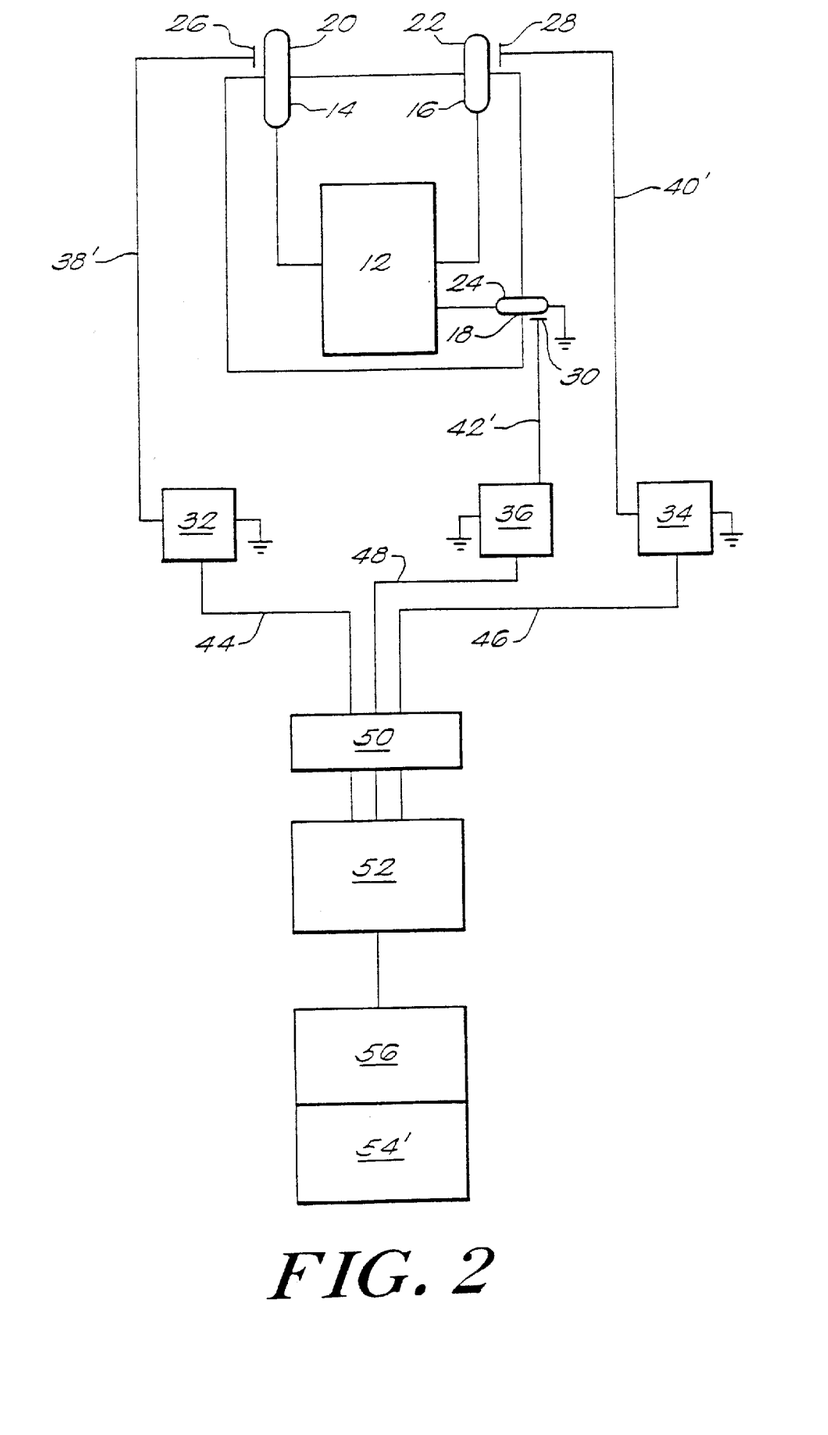
FIG. 2 is an illustrative block diagram of another embodiment of a system of the invention.

Another embodiment of the invention is shown in FIG. 2, where elements similar to those of FIG. 1 are identified using the same reference numbers as in FIG. 1. In the embodiment of FIG. 2, however, the cables 38', 40', and 42' are not all the same length. In this embodiment, the processor 54' must first adjust the arrival time of each recorded signal to ensure sufficient synchronization of the signals. To do this, the adjusting unit 56 of the processor must know the lengths of each of the cables. Once the signals are sufficiently synchronized, the simultaneous, synchronous signals may be analyzed as discussed herein. With this arrangement, an internal partial discharge signal is detected by the relative propagation of the pulse signal waveforms as seen at the different detection sites.

In further embodiments, there may be any number of openings in the housing. There must, however, be a sensor positioned at or near each and every housing opening to permit the system to determine all of the required characteristics of each partial discharge event, e.g., whether it originated inside or outside the housing.

Internal discharge events are milliampere peak size events, which are significantly smaller than the kiloampere level power frequency currents. Each discharge or pulse event produces signals that propagate internally and then appear at the detection sites in close time synchronization. Because an event results in signals at different access points according to each propagation path, it is useful to consider the transfer function model for their interpretation.

In the time domain, the received response from an originating true impulse is termed the impulse response h(t). In the frequency domain the response at a given frequency "s" is termed the "system function" response, H(s). Both forms, h(t) and H(s), contain information about the transfer system and each has advantages according to the specific information that is desired. Under this system function analysis, the partial discharge pulse signal arrives at a detector location after propagation with an arrival time delay.

Figure 3:
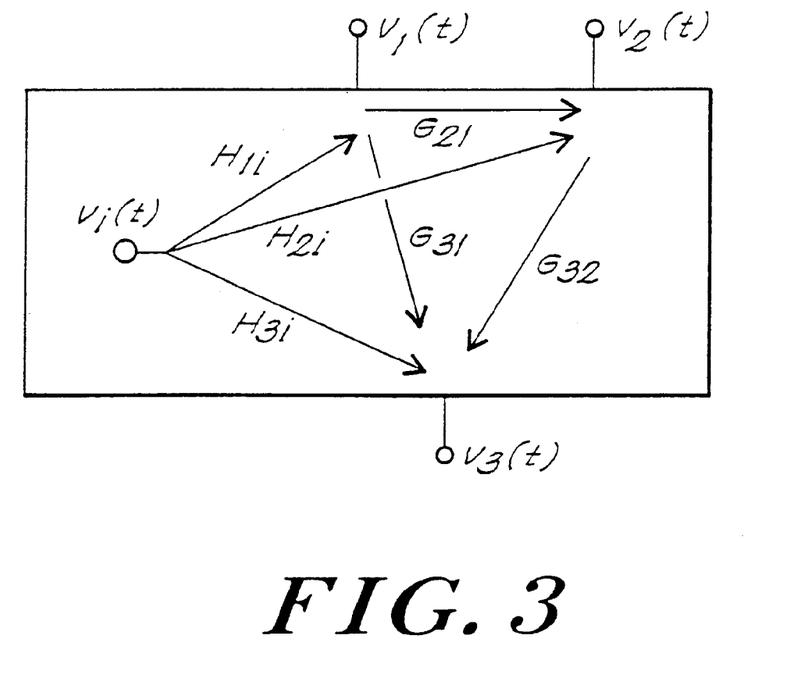
FIG. 3 is a block diagram of transfer functions and node coupling functions utilized in accordance with an embodiment of the invention.

For a pulse wave, the transfer functions from an event at some location (i) to detection nodes at (1), (2) and (3) are depicted in FIG. 3 by the H functions $H_{1i}$, $H_{2i}$ and $H_{3i}$. In FIG. 3, the coupling between nodes is identified by functions G. It is apparent that the transformer is convenient to such transfer analysis because the metal tank acts as an electromagnetic shield from outside interference. The entrance of external signals is therefore excluded except via distinct penetration points, such as bushings. The functions G provide information relating to the external noise pulse signals.

To illustrate this transfer concept, examples of measured pulses for the coupling of signals in a transformer are given for the case in which a known pulse is injected in a controlled situation. A fast-rising pulse signal is preferred because it contains a broader spectrum of frequencies. Injection into the transformer can be accomplished at one of the transformer bushing terminals. The response signals at the bushing taps are then measured synchronously and simultaneously with a system of the invention. The functional coupling characteristics may then be determined by analysis of the relation between the response signals.

Figure 4A:
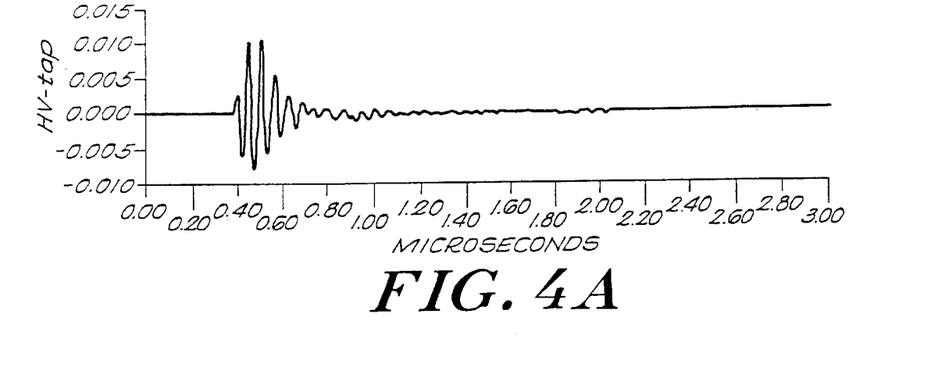
FIGS. 4A–4C are expanded graphs of the responses at each bushing in a system of the invention responsive to an introduced 1000 pC signal injected into the low voltage bushing terminal.
Figure 4B:
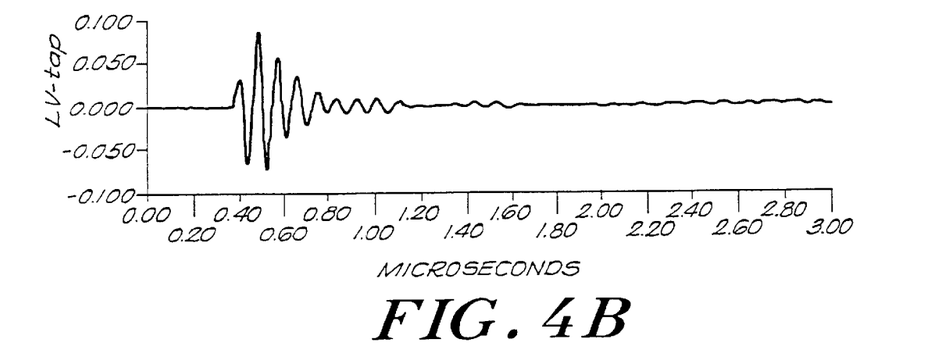
Figure 4C:
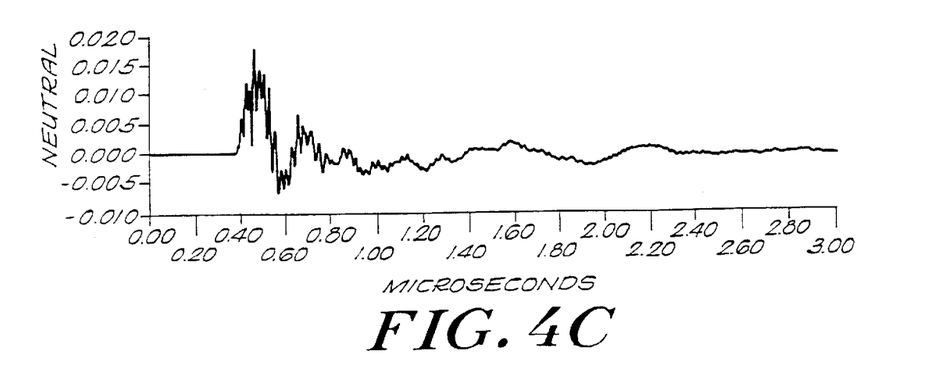

The graphs in FIGS. 4A–4C illustrate the case where a 1000 pC signal is injected into a low voltage bushing of an embodiment of the invention. Measurement of the response waveforms are made at the high voltage tap, the low voltage tap, and at the neutral tap. The graphs in FIG. 4 are shown expanded in that the horizontal scale is for a shorter time, 3 u-sec full span, and the vertical scale is expanded for the high voltage and neutral signals.

Note that the low voltage tap signal is largest, as expected, since the signal is injected at the low voltage bushing terminal. The signals at the high voltage terminal and the neutral terminal are much smaller in peak-to-peak size. The expanded view of these three signals shows that the low voltage tap response is mainly a high frequency ring of about 12 MHz, whereas the high voltage is small but comprised of a higher frequency, 18 MHz ring at first, and a small lower frequency ring nearer 1 MHz. The neutral shows some very high frequency (near 30 MHz), but mainly lower frequency (5 MHz) signal. An important result illustrated by these figures is that each sensing location has a response characteristic that is different than that of the others. This enables one to locate the origin of the signal.

To evaluate the system transfer functions, frequency domain representation for the transfer coupling coefficient is obtained by signal analysis. Using the typical notation of "FFT[ ]" to represent the fast fourier transform spectral analysis of signals, then the coupling between the high voltage tap relative to the low voltage tap becomes:

$$G_{HL_1} = \frac{FFT[v_{HVC}]}{FFT[v_{LVC}]}$$

This type of transfer response measurement can be achieved over a broad range of frequencies, even to frequencies of 100 MHz. At the higher frequencies the simple lumped equivalent circuit for bulk elements such as transformer windings becomes inaccurate to account for the fast pulse propagation and greater attention to traveling wave like properties of the structure must be included.

Figure 5A:
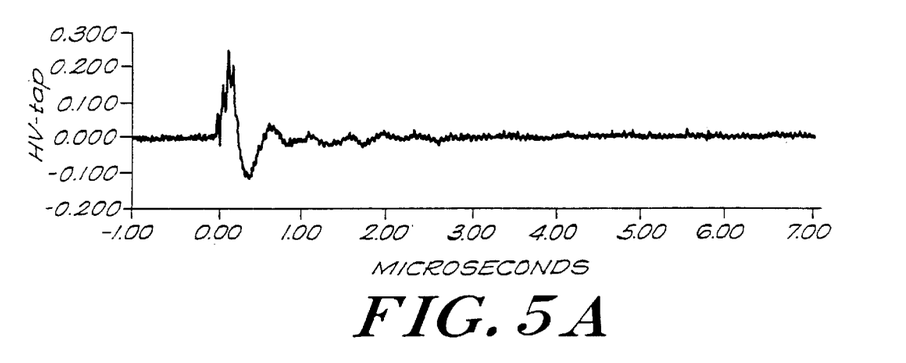
FIGS. 5A–5C are expanded graphs of the responses at each bushing in a system of the invention responsive to a partial discharge signal.
Figure 5B:
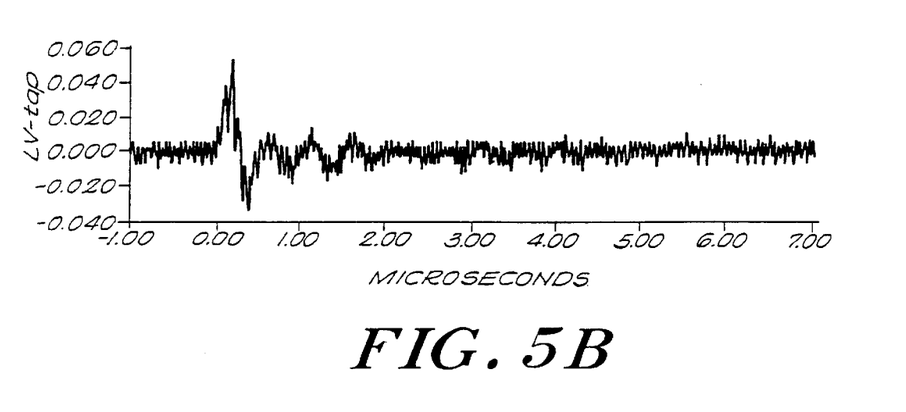
Figure 5C:
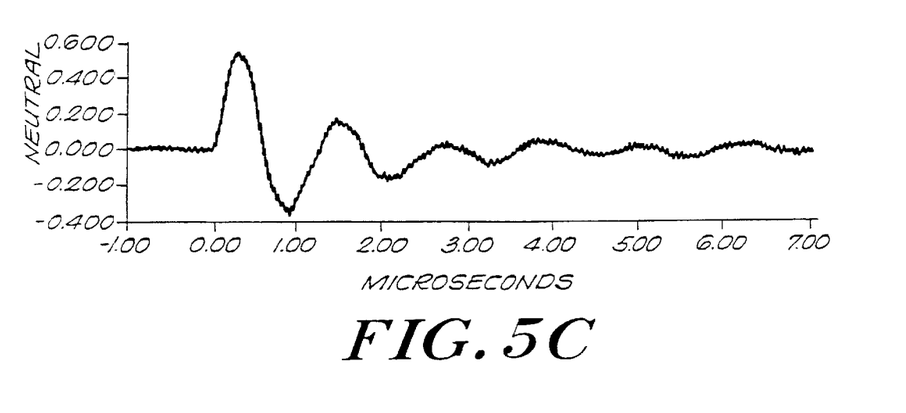

When an internal partial discharge event occurs, the measured pulse wave signals will change according to the location of the event. This is because the coupling to each of the detection sensors will be in accordance with the propagation of the pulse wave to the sensor. An event closer to the high voltage bushing will typically exhibit greater coupling to a sensor at the high voltage tap. An example of the type of time waveform signals that can be received for an internal event are shown in expanded form in FIGS. 5A–5C. Note that the shape and magnitudes differ markedly from those of the injected signal at the low voltage bushing discussed above with reference to FIGS. 4A–4C.

Distinctive features of internal partial discharge signals that are detectable by systems of the invention include the presence of very fast time variations and very rapid repetition of events on the order of a few microseconds. Because external events must enter via the long connections to the bushings there is added inductance and hence some slowing of the recorded waveforms compared to internal events with short distances and/or low-loss coupling to the detectors. Measurements on oil-paper insulation show that some internal events generate repeated fast pulses, separated in time by a few microseconds. A slow response measurement, such as the conventional external resonant circuit measurement, will not distinguish these features.

In yet another embodiment of the invention, the system may calibrate the influence of external noise by temporary connection of an external pulse source to a bushing that may be exposed to external noise. The sensors at all detection sites then synchronously record the injected pulse signal. This step of introducing an external signal for calibration is repeated at each of the other bushings that may receive external noise. This set of calibration signals then provide a representative waveform (or fingerprint waveform) set for external noise events. An internal signal is then distinguished as a set of measured waveforms that exhibit marked differences in waveshape, relative size and/or time of arrival as compared to the signals of external origin.

Systems of the invention may be used in oil-filled electrical apparatus, such as power transformers, and also other apparatus with different insulation systems such as solid polymer power cables, and network elements such as capacitors and inductors. For example, the system may be used to evaluate electrical partial discharge activity within 3-phase GSU transformers, or to evaluate discharge activity in high voltage shunt reactors. The system may also be used with an energized 500/345 kV auto transformer unit in a substation environment where the clear detection of internal static electrification discharges. may be established. The system may also be used to obtain reference measurements on a 345/110, 3-phase auto transformer in a substation environment, as well as obtaining measurements on a 115 kV three-phase shunt that correspond to standard factory partial discharge measurements during acceptance tests.

Those skilled in the art will appreciate that modifications and variations may be made to the above disclosed embodiments without departing from the spirit and scope of the invention.

What is claimed is:

1. A system for monitoring a partial discharge event in electrical power apparatus including a housing and a plurality of openings in said housing at spaced-apart locations through which electrical power may pass via electrical feedthroughs, said system comprising:
   a plurality of electrical sensor means, each being in communication and associated with an electrical feedthrough at an opening, for simultaneously and synchronously sensing an electrical component of the partial discharge event at each of the plurality of openings and for producing sensor output signals;
   waveform capturing means electrically coupled to the sensor means for simultaneously and synchronously receiving said sensor output signals over an interval of time, and for producing simultaneous synchronous captured waveform signals; and
   processing means electrically coupled to the waveform capturing means for processing said simultaneous synchronous captured waveform signals.

2. A system as claimed in claim 1, wherein said sensor output signals are representative of the amplitude and frequency of the electrical component of the partial discharge event for said interval of time.

3. A system as claimed in claim 1, wherein said sensor means comprise broadband sensors.

4. A system as claimed in claim 1, wherein said electrical power apparatus further includes power transformer windings located within the housing and said electrical feedthroughs are bushings electrically connected to the power transformer windings.

5. A system as claimed in claim 1, wherein said processing means determines the transfer function of said sensor output signals for distinguishing between partial discharge events originating outside of said housing, from partial discharge events originating inside said housing.

6. A system as claimed in claim 1, wherein said processing means determines the ratio (G) of the fast fourier transfer functions from an event at some location (i) for said captured waveform signals from at least two spaced-apart locations.

7. A system as claimed in claim 1, wherein said sensor means each include a capacitive tap at the associated electrical feedthrough, a high frequency sensor, a first cable extending between said capacitive tap and said high frequency sensor, and a second cable extending between the high frequency sensor and the waveform capturing means.

8. A system as claimed in claim 7, wherein said first and second cables associated with each sensor means are of a combined length between each corresponding electrical feedthrough and the waveform capturing means so as to provide for simultaneous transmission of the electrical component of the partial discharge event from the electrical feedthrough to the waveform capturing means, via the sensor output signals.

9. A system as claimed in claim 7, wherein said first and second cables associated with each sensor means are of different combined lengths between each corresponding electrical feedthrough and the waveform capturing means, and the difference between the different combined lengths is known.

10. A method of monitoring a partial discharge event in electrical power apparatus including a housing and a plurality of openings in said housing at spaced-apart locations through which electrical power may pass via electrical feedthroughs; said method comprising the steps of:
    simultaneously and synchronously measuring an electrical component of the partial discharge event at each of said feedthroughs at said plurality of housing openings;
    generating simultaneous synchronous partial discharge waveform signals that are representative of the partial discharge event from the spaced-apart locations and processing said simultaneous and synchronous partial discharge waveform signals to discern characteristics of said partial discharge event.

11. A method as claimed in claim 10, wherein said step of simultaneously and synchronously measuring the electrical component of the partial discharge event includes adjusting for differences in the time required for a signal to travel from each of said electrical feedthroughs.

12. A system for monitoring a partial discharge event in electrical power apparatus including a housing and a plurality of openings in said housing at spaced-apart locations through which electrical power may pass via bushings, said system comprising:
    a plurality of bushing taps, each of which is associated with a bushing, said bushing taps being capable of simultaneously producing a plurality of bushing tap signals from the plurality of openings in said housing responsive to a single partial discharge event;
    a plurality of broadband high frequency sensors, each of which is associated with a bushing tap, and each of which produces a sensor output waveform signal responsive to said bushing tap signal;

a waveform digitizer for receiving said plurality of sensor output waveform signals; and simultaneous and synchronous communication means for permitting said plurality of sensor output signals to be received by said waveform digitizer at the same time for the single partial discharge event.

13. A system as claimed in claim 12, wherein said simultaneous and synchronous communication means includes a plurality of equal length coaxial cables.

14. A system for monitoring a partial discharge event in electrical power apparatus including a housing and a plurality of openings in said housing at spaced-apart locations through which electrical power may pass via a first bushing and a second bushing, said system comprising:

a first bushing tap associated with the first bushing, said first bushing tap for producing a first bushing tap signal responsive to partial discharge event at time (t);

a second bushing tap associated with the second bushing, said second bushing tap for producing a second bushing tap signal that is different from said first bushing tap signal responsive to the partial discharge event at time (t);

a first broadband high frequency sensor associated with the first bushing tap, for producing a first sensor output waveform signal responsive to said first bushing tap signal;

a second broadband high frequency sensor associated with the second bushing tap, for producing a second sensor output waveform signal responsive to said second bushing tap signal;

a waveform digitizer for receiving said first and second sensor output waveform signals; and simultaneous and synchronous communication means for permitting said first and second sensor output signals to be received by said waveform digitizer at the same time for the single partial discharge event at time (t).

15. A system as claimed in claim 14, wherein said simultaneous and synchronous communication means includes a plurality of equal length coaxial cables.

* * * * *